(12) United States Patent
Son et al.

(10) Patent No.: US 10,417,970 B2
(45) Date of Patent: Sep. 17, 2019

(54) DISPLAY DEVICE

(71) Applicant: Samsung Display Co., Ltd., Yongin-si, Gyeonggi-do (KR)

(72) Inventors: Ho Seok Son, Yongin-si (KR); Tae Jin Kim, Yongin-si (KR); Soo Wan Yoon, Yongin-si (KR); Myung Ho Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 3 days.

(21) Appl. No.: 15/230,279

(22) Filed: Aug. 5, 2016

(65) Prior Publication Data

US 2017/0047016 A1 Feb. 16, 2017

(30) Foreign Application Priority Data

Aug. 10, 2015 (KR) .................... 10-2015-0112594

(51) Int. Cl.
| | | |
|---|---|---|
| *G09G 3/3275* | (2016.01) | |
| *G09G 3/20* | (2006.01) | |
| *G09G 3/3233* | (2016.01) | |
| *G09G 3/3266* | (2016.01) | |
| *H01L 27/32* | (2006.01) | |
| *H01L 27/12* | (2006.01) | |

(52) U.S. Cl.
CPC .......... *G09G 3/3275* (2013.01); *G09G 3/20* (2013.01); *G09G 3/3233* (2013.01); *G09G 3/3266* (2013.01); *H01L 27/3276* (2013.01); *G09G 2310/0281* (2013.01); *G09G 2310/08* (2013.01); *G09G 2320/0223* (2013.01); *H01L 27/124* (2013.01)

(58) Field of Classification Search
None
See application file for complete search history.

(56) References Cited

U.S. PATENT DOCUMENTS

| | | | | |
|---|---|---|---|---|
| 6,850,251 | B1 * | 2/2005 | Yasunishi | G09G 3/2051 345/691 |
| 2004/0189568 | A1 * | 9/2004 | Lee | G09G 3/2011 345/89 |
| 2007/0152947 | A1 | 7/2007 | Tanaka et al. | |
| 2009/0079767 | A1 * | 3/2009 | Morita | G09G 3/3688 345/690 |
| 2010/0156945 | A1 * | 6/2010 | Yoshida | G02F 1/1345 345/690 |

(Continued)

FOREIGN PATENT DOCUMENTS

| | | |
|---|---|---|
| EP | 3046102 A1 | 7/2016 |
| KR | 10-2012-0054683 A | 5/2012 |
| KR | 10-2015-0002030 A | 1/2015 |

OTHER PUBLICATIONS

European Search Report for corresponding EP Application No. 16183599.6, dated Nov. 23, 2016, pp. 1-9.

*Primary Examiner* — Duane N Taylor, Jr.
(74) *Attorney, Agent, or Firm* — Innovation Counsel LLP

(57) ABSTRACT

A display device includes: a display unit including a plurality of pixels connected with data lines and scan lines with different lengths; a data driver configured to supply a data signal to the data lines; a scan driver configured to supply a scan signal to the scan lines; and a timing controller controlling the data driver to supply the data signal to the data lines at different output timings according to a position of a scan line to which the scan signal is supplied.

12 Claims, 5 Drawing Sheets

(56) References Cited

U.S. PATENT DOCUMENTS

| | | | |
|---|---|---|---|
| 2012/0127412 A1 | 5/2012 | Lee et al. | |
| 2012/0268707 A1* | 10/2012 | Yamashita | G09G 3/3607 |
| | | | 349/143 |
| 2014/0043306 A1* | 2/2014 | Min | G09G 3/3685 |
| | | | 345/204 |
| 2014/0375922 A1 | 12/2014 | Park et al. | |
| 2015/0022562 A1* | 1/2015 | Tsubakino | G09G 3/3275 |
| | | | 345/690 |

* cited by examiner

DISPLAY DEVICE

CROSS-REFERENCE TO RELATED APPLICATION

This application claims priority to and the benefit of Korean Patent Application No. 10-2015-0112594, filed on Aug. 10, 2015, in the Korean Intellectual Property Office, the entire contents of which are incorporated herein by reference in their entirety.

BACKGROUND

1. Field

The present disclosure relates to a display device, and more particularly to, a display device capable of improving display quality by decreasing a data charging rate deviation.

2. Description of the Related Art

Among the display devices, a flat panel display that has excellent quality of screen, is light weight, and has low power consumption is frequently used. A display device may include a liquid crystal display, an organic light emitting display, etc. The display device may include a display unit in which a plurality of pixels are arranged in the matrix configuration, a scan driver supplying a scan signal, and a data driver supplying a data signal.

The display device may have a structure in which the scan driver is arranged on one side of the display unit and the data driver is arranged on another side of the display unit. However, the display device utilized in a mobile device requires a narrow bezel having a minimized non-display region of both sides. In order to embody the narrow bezel, a panel in the formation of a single-side driving in which the scan driver and the data driver are arranged on one side has been studied.

However, when the display device panel is in the formation of single-side driving, the scan lines have a different length from each other, and due to a wiring structure, lack of uniformity of RC load occurs, and a data charge rate deviation occurs. As a result, the display quality is reduced since a scan signal and a data signal are not supplied to pixels at an accurate timing.

SUMMARY

The present disclosure provides a display device capable of improving display quality by decreasing a data charge rate deviation.

A display device according to an exemplary embodiment may include a display unit including a plurality of pixels connected with data lines and scan lines with different lengths; a data driver configured to supply a data signal to the data lines; a scan driver configured to supply a scan signal to the scan lines; and a timing controller configured to control the data driver to supply the data signal to the data lines at different output timings according to a position of a scan line to which the scan signal is supplied.

The scan lines may include main scan lines connected to the pixels by row and sub-scan lines connecting the scan driver with the main scan lines. The data lines may be connected to the pixels by column. The data lines and the sub-scan lines may extend in parallel, and the sub-scan lines and the data lines may be arranged alternately with each other.

The data driver may include a plurality of data drivers, and the timing controller may include a plurality of line memories configured to temporarily store image data corresponding to a 1 horizontal line divided corresponding to the plurality of data drivers. The timing controller may include a data timing controller configured to generate data timing control signals to control the data drivers to cause the data signal output corresponding to the scan signal to be supplied at the different output timings within a 1 horizontal time (1 H time).

The data timing controller may control the data drivers to control an output timing of the data signal at an interval of the 1 horizontal line/m, m being a natural number corresponding to a count of the data lines. The data timing controller may be configured to transmit scan line information relating to the scan lines to which the scan signal is supplied to the line memories, and the line memories may be configured to control an output timing of the image data according to the scan line information.

The main scan lines may have the same length, and lengths of the sub-scan lines may be reduced toward a first direction. The timing controller may be configured to control the data driver to delay an output timing of the data signal supplied to the data lines positioned in a first line rather than the data lines in a second direction opposite to the first direction, among the data lines, when the scan signal is supplied to n/2 scan lines of which the sub-scan lines are relatively short, among n scan lines, and the timing controller may control the data driver to delay the output timing of the data signal supplied to the data lines positioned in the second direction rather than the data lines in the first direction when the scan signal is supplied to the other n/2 scan lines of which the sub-scan lines are relatively long, among the n scan lines.

The data driver may be configured to control the output timing of the data signal by changing a slew rate of the data signal output to each of the data lines. The scan driver and the data driver may be arranged on one side of the display unit.

BRIEF DESCRIPTION OF THE DRAWINGS

Example embodiments are now described more fully hereinafter with reference to the accompanying drawings; however, they may be embodied in different forms and should not be construed as limited to the embodiments set forth herein. Rather, these embodiments are provided to help convey the scope of the example embodiments to those skilled in the art.

In the drawing figures, dimensions may be exaggerated for clarity of illustration. When an element is referred to as being "between" two elements, it may be the only element between the two elements, or one or more intervening elements may also be present. Like reference numerals refer to like elements throughout.

DETAILED DESCRIPTION

Figure 1A:
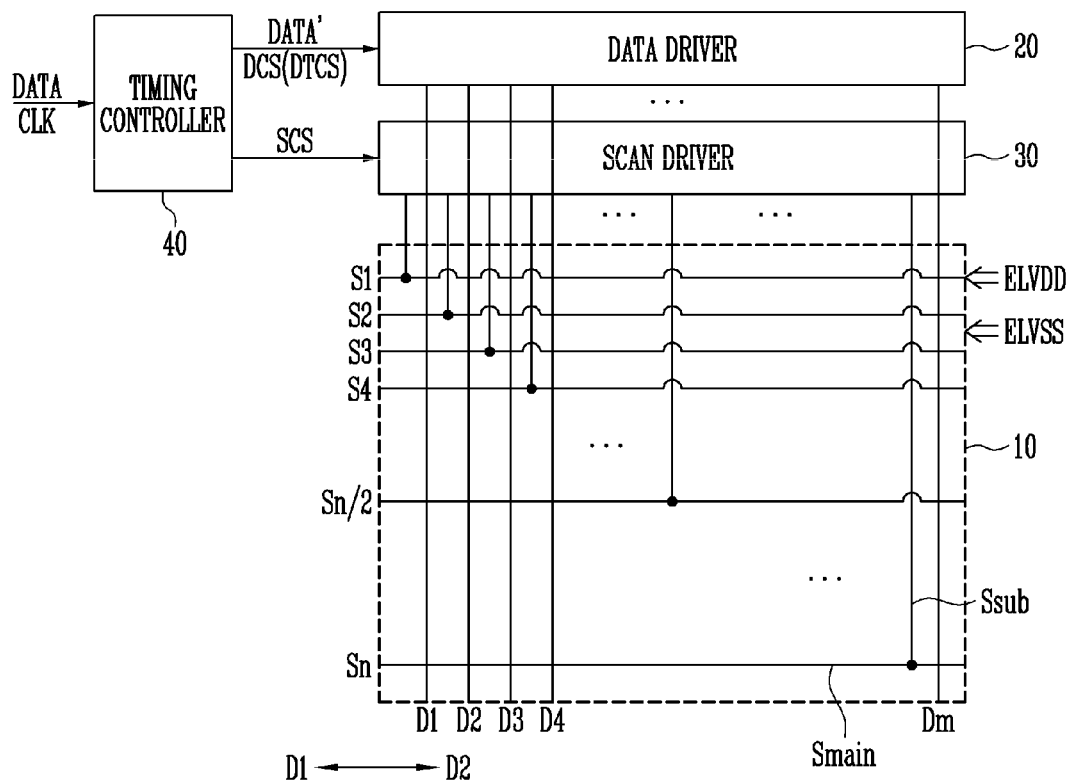
FIG. 1A is a schematic block diagram of a display device according to an embodiment.
Figure 1B:
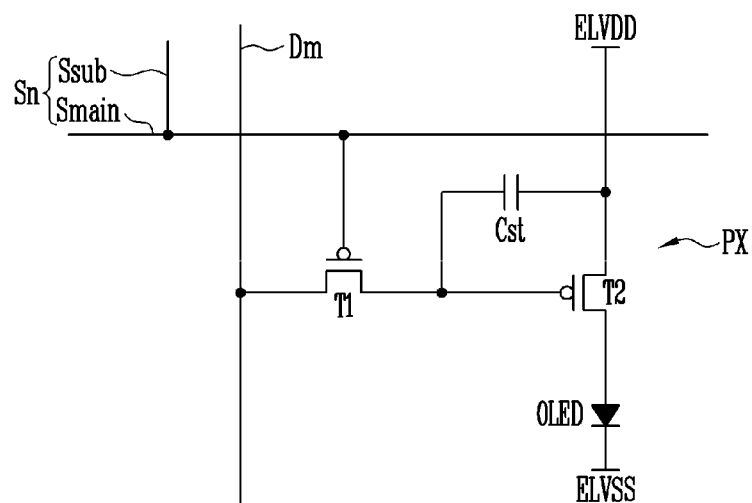
FIG. 1B is a circuit diagram illustrating pixels of the display device as shown in FIG. 1A.

Example embodiments are now described more fully hereinafter with reference to the accompanying drawings;

FIG. 1A is a schematic block diagram of a display device according to an embodiment; and FIG. 1B is a circuit diagram illustrating pixels of the display device as shown in FIG. 1A.

Referring to FIG. 1A, a display device according to the embodiment may include a display unit 10, a data driver 20, a scan driver 30 and a timing controller 40.

The display unit 10 may include a plurality of pixels connected to scan lines S1 to Sn and data lines D1 to Dm. The display device according to the embodiment may be a display device of single-side driving in which the data driver 20 and the scan driver 30 are arranged on one side. Each of the scan lines S1 to Sn may include main scan lines Smain connected to the pixels by a row and sub-scan lines Ssub connecting the scan driver 30 with the main scan lines Smain. Since the distances between the main scan lines Smain and the scan driver 30 are different from each other, each of the sub-scan lines Ssub may have a different length. The data lines D1 to Dm may be connected to the pixels by column.

The data lines D1 to Dm and the sub-scan lines Ssub may be in parallel, and the sub-scan lines Ssub and the data lines D1 to Dm may be alternately arranged with each other. The main scan lines Smain may have the same length, and the sub-scan lines Ssub may be arranged to be shorter toward a first direction D1.

The first direction D1 may be a left side, such as shown in FIG. 1A. However, the present disclosure is not limited to a wiring structure of the scan lines S1 to Sn. According to another embodiment, the sub-scan lines Ssub may be arranged to be shorter toward a second direction D2 that is the opposite to the first direction D1. The second direction D2 may be a right side, such as shown in FIG. 1A.

The pixels arranged in the matrix configuration in the display unit 10 may receive a scan signal through the scan lines S1 to Sn, and a data signal through the data lines D1 to Dm. The pixels may emit light with brightness corresponding to the data signal supplied from the data lines D1 to Dm when the scan signal is supplied from the scan lines S1 to Sn. The display unit 10 according to the embodiment of FIG. 1A may be a display unit of an organic light-emitting diode OLED.

Referring to FIG. 1B, each pixel PX according to the embodiment may include the organic light-emitting diode OLED, and receive a high power voltage ELVDD and a low power voltage ELVSS from an external device. Further, the pixel PX may include a capacitor Cst, a first transistor T1, and a second transistor T2. As described above, the scan line Sn may include the main scan lines Smain directly connected to the pixel PX and the sub-scan line Ssub connecting the scan driver 30 with the main scan line Smain. However, the pixel PX included in the display device is not limited to the embodiment of FIG. 1B.

Referring a driving method of the pixel PX, the scan line having a gate-on level through the scan line Sn may be applied, and the first transistor T1 may be turned on. When the transistor T1 is turned on, the data signal supplied through the data line Dm may be applied to a gate electrode and the capacitor Cst of the second transistor T2. While the data signal is supplied through the data line Dm, a data voltage corresponding to the data signal may be charged in the capacitor Cst. The second transistor may generate the driving current and output the driving current to the organic light-emitting diode OLED according to the data voltage. The organic electro organic light-emitting diode OLED may emit light with brightness corresponding to the driving current.

The data driver 20 may be connected to a plurality of data lines D1 to Dm, generate the data signal on the basis of a data control signal DCS and image data DATA' of the timing controller 40, and output the generated data signal to the data lines D1 to Dm. The data control signal DCS may include a data timing control signal DTCS configured to control an output timing of the data signal. The data driver 20 may control the output timings of the data signal, which output to the data lines D1 to Dm differently from each other in response to the data timing control signal DTCS. In detail, the data signal supplied to the data lines D1 to Dm may be supplied to the pixels selected by a scan line when the scan signal is supplied. A data voltage corresponding to the data signal may be charged into the pixels. When the output timings of the data signal supplied to each pixel are different from each other, the data signal may be supplied to the pixels at different timings, and each data charge rate of the pixels may be controlled.

The scan driver 30 may be connected to the plurality of scan lines S1 to Sn, and generate a driving signal in response to a scan control signal SCS of the timing controller 40, and output the generated scan signal to the scan lines S1 to Sn sequentially. The scanning driver 30 may be composed of the plurality of stage circuits, and when the scan signal is supplied to the scan lines S1 to Sn sequentially, the pixels may be selected by a unit of horizontal line. However, the scan driver 30 may perform an operation outputting an emitting control signal to the plurality of emitting control lines (not illustrated) connected with the pixels in addition to the scan signals.

The scan driver 30 and the data driver 20 may be arranged on one side of the display unit 10. The data driver 20 may be arranged on one side of the display unit 10 and the scan driver 30 may be arranged on another side opposite to the one side thereof. Therefore, the display device 10 may include the narrow bezel with a minimized non-display region of both sides of the display unit 10.

The timing controller 40 may receive the image data DATA and a clock signal CLK to control a display thereof. The timing controller 40 may perform image processing of input image data DATA and generate the compensated image data DATA' to be suitable to an image display of the display unit 10 and output DATA' to the data driver 20. Further, the timing controller 40 may generate and output driving control signals SCS and DCS configured to control the driving of the scan driver 30 and the data driver 20 on the basis of the clock signal CLK.

The timing controller 40 may control the data driver 20 to supply the data signal to the data lines D1 to Dm at different timings according to the position of the scan lines to which the scan signal is supplied. In other words, the scan signal may not be supplied to all the scan lines S1 to Sn at the same time, but to each of the scan lines S1 to Sn sequentially. The timing controller 40 may determine the position of the scan line in the display unit 10 to which the scan signal is supplied, and control the data driver 20 to cause the data signal, which is synchronized to the timing when the scan signal is supplied, to be output to the data lines D1 to Dm at different timings, that is, not at the same time. To this end, the timing controller 40 may generate the data timing control signal DTCS to control the output timing of the data signal. The specific description of the timing controller 40 is described with reference to FIG. 3.

Figure 2A:
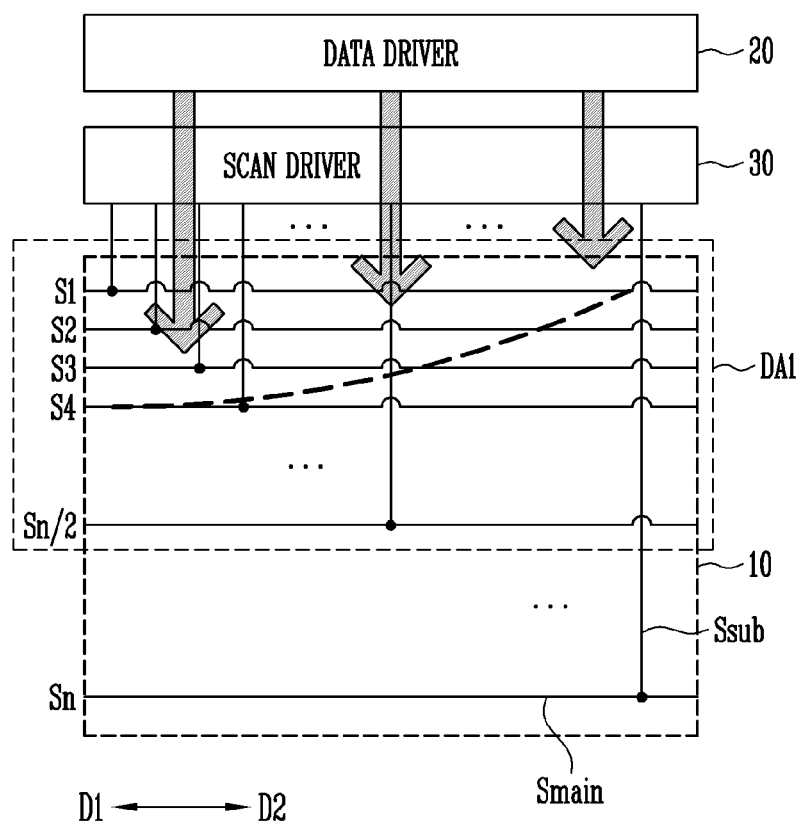
FIGS. 2A and 2B illustrate a data charge rate deviation.
Figure 2B:
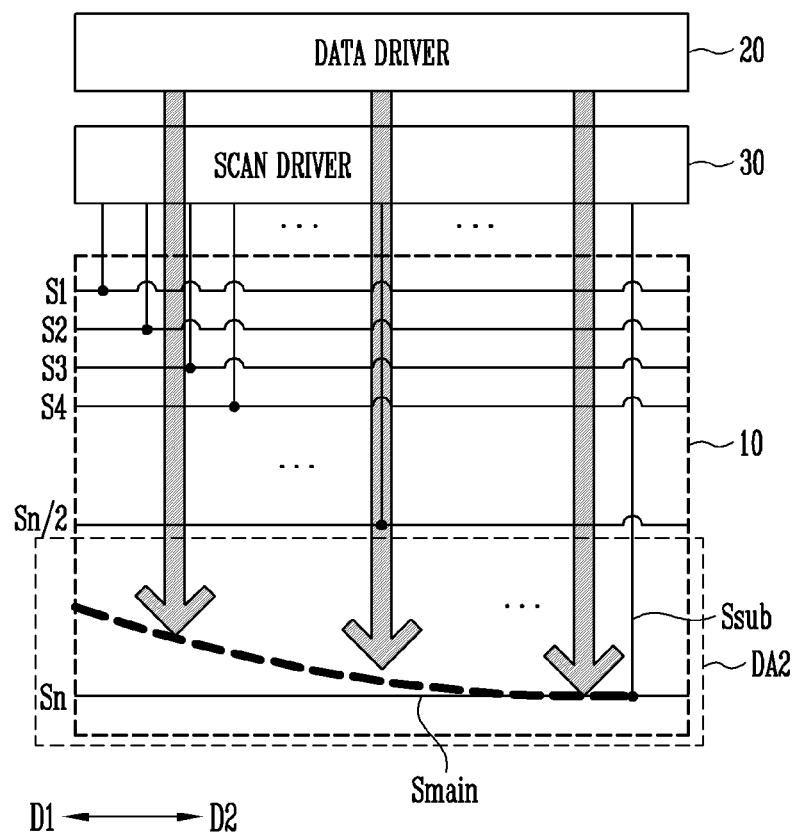

FIGS. 2A and 2B illustrate a data charge rate deviation.

Referring to FIGS. 2A and 2B, the main scan lines Smain, among the scan lines S1 to Sn, may be arranged in parallel. The sub-scan lines Ssub and the data lines D1 to Dm, among the scan lines S1 to Sn, may be arranged vertically. The main scan lines Smain may be connected to the pixels by a unit of line, and the sub-scan lines Ssub may electrically connect the main scan lines Smain with the driver 30. The main scan lines Smain may have the same length and the sub-scan lines Ssub may be arranged to be shorter toward the first direction D1. That is, the length of the scan lines S1 to Sn may get shorter toward the first direction D1, and get longer toward the second direction D2.

In the wiring structure, the RC load of n/2 scan lines S1 to Sn/2 in which the main scan lines Smain are positioned at a first region DA1 at an upper side of the display unit 10, among n scan lines S1 to Sn, may increase toward the second direction D2 since the scan signal is generally transmitted in a second direction D2 on the main scan lines Smain In this case, a supply timing of the scan signal supplied to each pixel may be more delayed toward the second direction D2, so that a charge timing of a data voltage may be more delayed toward the second direction D2. Accordingly, a charge rate of the data voltage may be reduced as the pixels are positioned in the second direction D2 among the pixels connected to the same scan line.

On the other hand, the RC load of the n/2 scan lines Sn/2+1 to Sn in which the main scan lines Smain may be positioned at a second region DA2 at the upper side of the display unit 10, among the n scan lines S1 to Sn, may increase toward a first direction D1 since the scan signal is generally transmitted in the first direction D1 on the main scan lines Smain. In this case, the supply timing of the scan signal supplied to each pixel may be more delayed toward the first direction D1, so that the charge timing of the data voltage may be more delayed toward to the first direction D1. Accordingly, the charge rate of the data voltage may be reduced as the pixels are positioned in the first direction D1 among the pixels connected to the same scan line.

In detail, each pixel may charge the data voltage corresponding to the data signal. A predetermined time may be required to charge the data voltage to a predetermined voltage level. It may be required to complete a charge of the data voltage within a 1 horizontal time (1 H time) during which the scan signal is applied. When the pixels are in the same row, the data signal output at the same time may be transmitted to the pixels simultaneously. When the scan signal is supplied to the pixels in a first row, each pixel may start charging the data voltage at the same time. However, when the scan signal is not supplied to the pixels in the first row at the same time but at the different time, the pixels that receive the scan lines relatively late may start charging the data voltage late. Therefore, when the supply timings of the scan signal supplied to each pixel are different from each other, the data charge rate deviation may occur.

For example, in the case of a first scan line S1, the pixels positioned in the first direction D1 from the main scan line of the first scan line S1 may charge the data voltage relatively quickly. However, the pixels positioned in the second direction D2 may charge the data voltage relatively slowly. In the case of the n-th scan line Sn, the pixels positioned in the second direction D2 from the main scan line of the n-th scan line Sn may charge the data voltage relatively quickly. However, the pixels positioned in the first direction D1 may charge the data voltage relatively slowly. Further, the data charge rate deviation may occur between the pixels connected to the first scan line S1 and the pixels connected to the n-th scan line Sn. As a result, the display quality may be reduced due to the non-uniformity of the data charge rate between the pixels.

Figure 3:
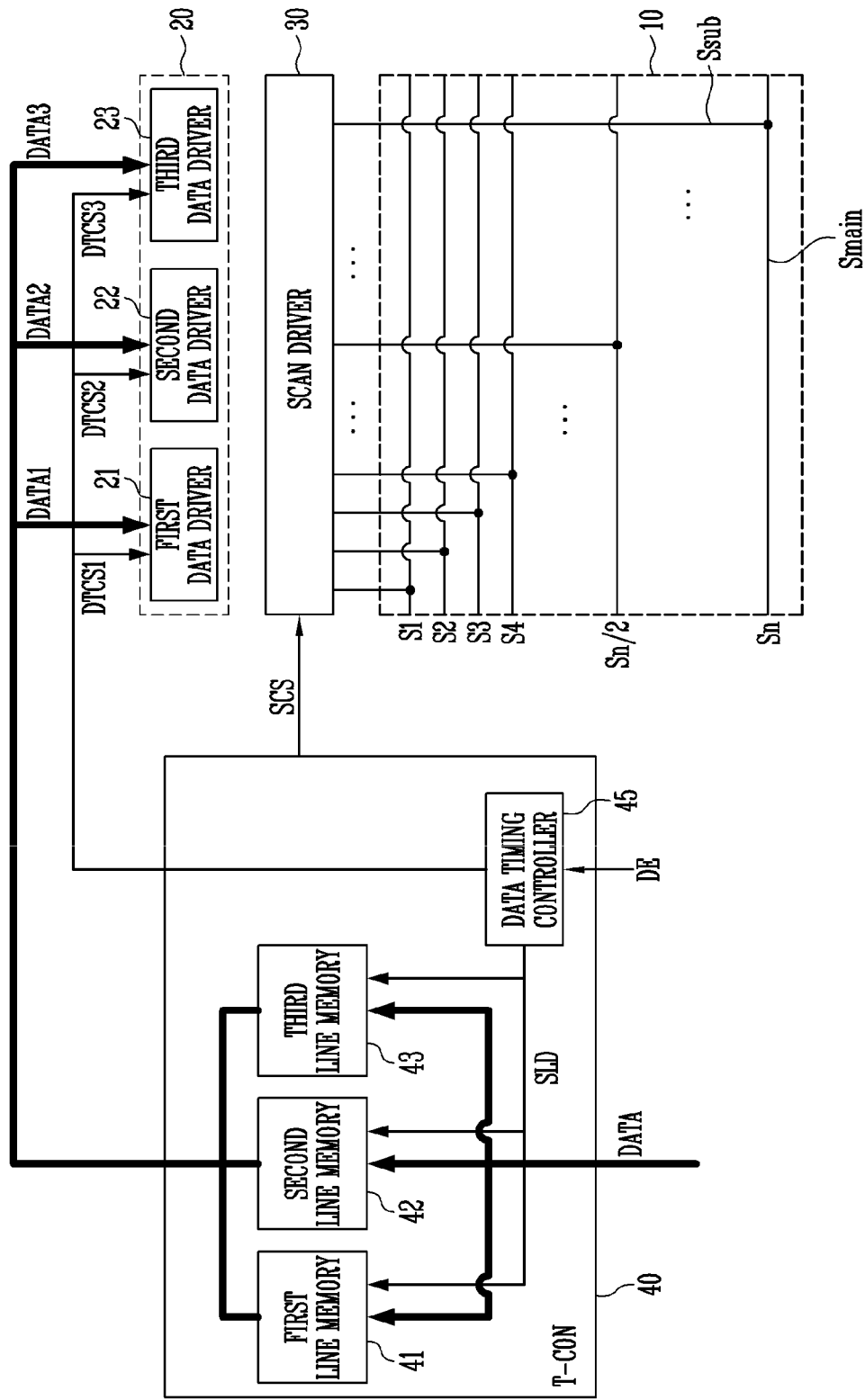
FIG. 3 is a detailed block diagram of a timing controller.
Figure 4A:
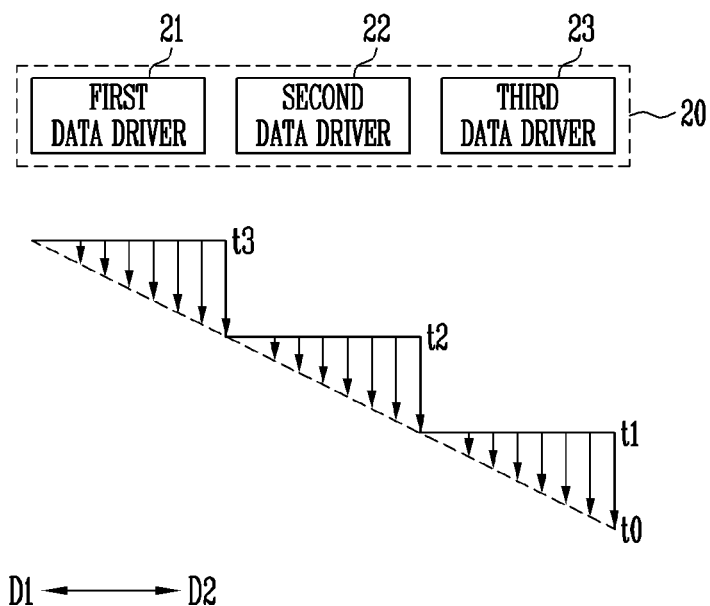
FIGS. 4A and 4B illustrate embodiments in which an output timing of a data signal is controlled.
Figure 4B:
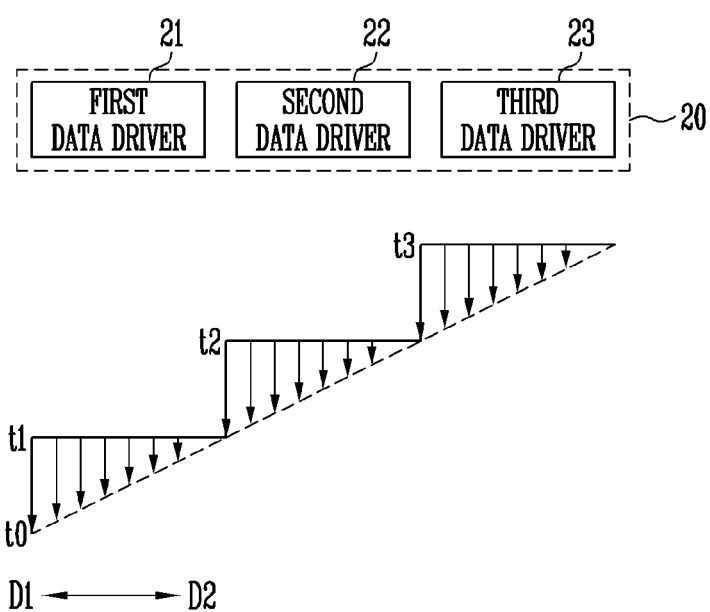

FIG. 3 is a detailed diagram of a timing controller. FIGS. 4A and 4B illustrate the embodiments controlling the output timing of a data signal.

Referring to FIG. 3, the data driver 20 according to the embodiment may be a plurality of data drivers, and each of the plurality of data drivers may supply a data signal to each of the data lines D1 to Dm. For example, a first data driver 21 may be connected to a first group of the data lines D1 to Dm and supply the data signal whose output timing is controlled differently in response to a first data timing control signal DTCS1 of the data timing controller 40 to the first group of the data lines D1 to Dm. A second data driver 22 may be connected to a second group of the data lines D1 to Dm and supply the data signal whose output timing is controlled differently in response to a second data timing control signal DTCS2 of the data timing controller 40 to the second group of the data lines D1 to Dm. A third data driver 23 may be connected to a third group of the data lines D1 to Dm and supply the data signal whose output timing is controlled differently in response to a third data timing control signal DTCS3 of the data timing controller 40 to the third group of the data lines D1 to Dm.

The timing controller 40 may include a plurality of line memories 41, 42 and 43 and a data timing controller 45. The plurality of line memories 41, 42 and 43 may temporarily store the image data DATA of a 1 horizontal line divided corresponding to the plurality of data drivers 21, 22 and 23. For example, a first line memory 41 may store first image data DATA1 and output the first image data DATA1 to the first data driver 21; a second line memory 42 may store second image data DATA2 and output the second image data DATA2 to a second data driver 22; and a third line memories 43 may store third image data DATA3 and output the third image data DATA3 to a third data driver 23. The plurality of line memories 41, 42 and 43 may control the output timing of the image data DATA by controlling of the data timing controller 45.

The data timing controller 45 may generate data timing control signals DTCS1, DTCS2 and DTCS3 to control data drivers 21, 22 and 23 such that the data signal output corresponding to the scan signal is supplied at the different output timings within a 1 horizontal time (1 H time). For example, with regard to m data lines, the data timing controller 45 may control the data drivers 21, 22 and 23 to control an output timing of the data signal at a 1 horizontal time/m interval.

Further, the data timing controller 45 may transmit scan line information SLD relating to the scan line to which the scan signal is supplied to the line memories 41, 42 and 43 in response to a data enable signal DE. The scan line information SLD may include information regarding which scan lines the scan signal is supplied, among the scan lines S1 to Sn, and output timing information of the data signal that is already determined for each of the scan lines S1 to Sn. The line memories 41, 42 and 43 may control the output timing of the first to third image data DATA1, DATA2 and DATA3 according to the scan line information SLD.

For example, when the scan signal is supplied to the first scan line S1, the output timing of the image data may be determined in sequence of the third line memory 43, the second line memory 42 and the first line memory 41. In other words, after the third image data DATA3 is supplied to the third data driver 23, the second image data DATA2 is supplied to the second data driver 22, and the first image data DATA1 is supplied to the first data driver 21. When the scan signal is supplied to the n-th scan line Sn, the output timing of image data may be determined in sequence of the first line memory 41, the second line memory 42 and the third line memory 43. In other words, after the first image data DATA1 is supplied to the first data driver 21, the second image data DATA2 is supplied to the second data driver 22, and the third image data DATA3 is supplied to the third data driver 23.

Further, the data drivers 21, 22 and 23 may control the output timing of the data signal by changing a slew rate of the data signal output to each of the data lines D1 to Dm.

FIGS. 4A and 4B illustrate the embodiments controlling an output timing of a data signal.

Referring to FIG. 4A, when it is considered that a scan signal may be supplied to n/2 scan lines S1 to Sn/2 in which the sub-scan lines Ssub are relatively short, among the n scan lines S1 to Sn, the data timing controller 45 may control the data driver 20 to delay the output timing of the data signal supplied to the data lines positioned in a first direction D1 rather than a second direction D2, among the data lines D1 to Dm. For example, while the scan signal is supplied to the first scan line S1, the data voltage may be charged relatively rapidly in the pixels positioned in the first direction D1. Therefore, the data timing controller 45 may delay the output timing of the data signal by a predetermined time. On the other hand, since the data voltage may be charged relatively slowly in the pixels positioned in the second direction D2, the data timing controller 45 may advance the output timing of the data signal by a predetermined time.

When the supply period is divided into a first section t0 to t1, a second section t1 to t2 after the first section t0 to t1, and a third section t2 to t3 after the second section t1 to t2 on the basis of a supply starting point t0 of the scan signal, the third data driver 23 may output the data signal at the 1 horizontal time/m interval during the first section t0 to t1, and subsequently, the second data driver 22 may output the data signal at the 1 horizontal time/m interval during the second section t1 to t2, the first data driver 21 may output the data signal at the 1 horizontal time/m interval during the third section t2 to t3. As a result, the data signal may be transferred relatively quickly to the pixels positioned in the second direction D2 and the data voltage may be charged. However, the data voltage may be charged relatively slowly into the pixels positioned in the first direction D1. Accordingly, the data charge deviation generated by an increase of a RC load to the second direction D2 may be reduced.

Referring to FIG. 4B, when it is considered that the scan signal may be supplied to the n/2 scan lines Sn/2+1 to Sn in which the sub-scan lines Ssub are relatively long, among the n scan lines S1 to Sn, the data timing controller 45 may control the data driver 20 to delay the output timing of the data signal supplied to the data lines positioned in the second direction D2 rather than the first direction D1. For example, while the scan signal is supplied to the n-th scan line Sn, the data voltage may be charged relatively quickly into the pixels positioned in the second direction D2. The data timing controller 45 may delay the output timing of the data signal by the predetermined time. On the other hand, since the data voltage may be charged relatively slowly into the pixels in the first direction D1, the data timing controller 45 may advance the output timing of the data signal by the predetermined time.

The first data driver 21 may output the data signal by the 1 horizontal time/m interval during the first period t0 to t1; subsequently, the second data driver 22 may output the data signal by the 1 horizontal time/m interval during the second period t1 to t2; and next, third data driver 23 may output the data signal by the 1 horizontal time/m interval during the third period t2 to t3. As a result, the data signal is relatively quickly transferred to the pixels positioned in the first direction D1 and the data voltage may be charged. However, the data voltage may be charged relatively slowly in the pixels positioned in the second direction D2. Accordingly, the data charge deviation generated by an increase of RC load to the first direction D1 may be reduced.

According to the present disclosure, since the output timing of the data signal is controlled according to the position of the scan line to which the scan signal is supplied, display quality may be improved by decreasing a data charging rate deviation according to a RC load difference of the scan lines.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, those of skill in the art would understand that various changes in form and details may be made without departing from the spirit and scope of the following claims.

What is claimed is:

1. A display device, comprising:
a display unit including a plurality of pixels connected with data lines and scan lines with different lengths;
a data driver configured to supply a data signal to the data lines, wherein the data driver includes at least three data drivers;
a scan driver configured to supply a scan signal to the scan lines; and
a timing controller configured to control the data driver to supply the data signal to the data lines at output timings according to a position of a scan line to which the scan signal is supplied, wherein, during a first horizontal period corresponding to a first scan line among the scan lines, the data driver supplies respective first data signals to a plurality of different first data lines among the data lines at different output timings in a first sequence,
wherein first pixels among the plurality of pixels are connected with the first scan line and the respective first data lines,
wherein the first pixels store the respective first data signals in the first horizontal period,
wherein, during a second horizontal period corresponding to a second scan line among the scan lines, the data driver supplies respective second data signals to the plurality of different first data lines at different output timings in a second sequence,
wherein second pixels among the plurality of pixels are connected with the second scan line and the respective first data lines,
wherein the second pixels store the respective second data signals in the second horizontal period, and
wherein the first sequence and the second sequence are different.

2. The display device of claim 1, wherein the scan lines include main scan lines connected to the pixels by row and sub-scan lines connecting the scan driver with the main scan lines.

3. The display device of claim 2, wherein the data lines are connected to the pixels by column.

4. The display device of claim 3, wherein the data lines and the sub-scan lines extend in parallel, and the sub-scan lines and the data lines are arranged alternately with each other.

5. The display device of claim 3, wherein the data driver includes a plurality of data drivers, and
the timing controller includes a plurality of line memories configured to temporarily store image data corresponding to a 1 horizontal line divided corresponding to the plurality of data drivers.

6. The display device of claim 5, wherein the timing controller includes a data timing controller configured to generate data timing control signals to control the data drivers to cause the data signal output corresponding to the scan signal to be supplied at the different output timings within a 1 horizontal time (1H time).

7. The display device of claim 6, wherein the data timing controller is configured to control the data drivers to control an output timing of the data signal at an interval of the 1 horizontal line/m, m being a natural number corresponding to a count of the data lines.

8. The display device of claim 6, wherein the data timing controller is configured to transmit scan line information relating to the scan lines to which the scan signal is supplied to the line memories, and
the line memories are configured to control an output timing of the image data according to the scan line information.

9. The display device of claim 3, wherein the main scan lines have the same length, and
lengths of the sub-scan lines are reduced toward a first direction.

10. The display device of claim 9, wherein the timing controller is configured to control the data driver to delay an output timing of the data signal supplied to the data lines positioned in a first line rather than the data lines in a second direction opposite to the first direction, among the data lines, when the scan signal is supplied to $n/2$ scan lines of which the sub-scan lines are short relative to other $n/2$ scan lines, among n scan lines, and
the timing controller is configured to control the data driver to delay the output timing of the data signal supplied to the data lines positioned in the second direction rather than the data lines in the first direction when the scan signal is supplied to the other $n/2$ scan lines of which the sub-scan lines are long relative to the $n/2$ scan lines, among the n scan lines.

11. The display device of claim 10, the data driver is configured to control the output timing of the data signal by changing a slew rate of the data signal output to each of the data lines.

12. The display device of claim 1, wherein the scan driver and the data driver are arranged on one side of the display unit.

* * * * *